United States Patent
Chang et al.

(10) Patent No.: US 8,541,101 B2
(45) Date of Patent: Sep. 24, 2013

(54) COATING, ARTICLE COATED WITH COATING, AND METHOD FOR MANUFACTURING ARTICLE

(75) Inventors: Hsin-Pei Chang, Tu-Cheng (TW); Wen-Rong Chen, Tu-Cheng (TW); Huann-Wu Chiang, Tu-Cheng (TW); Cheng-Shi Chen, Tu-Cheng (TW); Zhi-Jie Hu, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 204 days.

(21) Appl. No.: 13/008,984

(22) Filed: Jan. 19, 2011

(65) Prior Publication Data
US 2012/0052276 A1 Mar. 1, 2012

(30) Foreign Application Priority Data
Aug. 30, 2010 (CN) .......................... 2010 1 0266716

(51) Int. Cl.
*B32B 9/00* (2006.01)
(52) U.S. Cl.
USPC ........... 428/336; 428/469; 428/472; 428/697; 428/698; 428/699
(58) Field of Classification Search
USPC .................. 428/336, 469, 472, 697, 698, 699
See application file for complete search history.

(56) References Cited

U.S. PATENT DOCUMENTS

| | | | |
|---|---|---|---|
| 5,656,383 A * | 8/1997 | Tanaka et al. | 428/699 |
| 6,492,011 B1 * | 12/2002 | Brandle et al. | 428/697 |
| 6,811,581 B2 * | 11/2004 | Yamada et al. | 428/472 |

* cited by examiner

*Primary Examiner* — Archene Turner
(74) *Attorney, Agent, or Firm* — Altis Law Group, Inc.

(57) ABSTRACT

A coating includes a titanium aluminum layer; a titanium aluminum nitride layer deposited on the titanium aluminum layer; a titanium aluminum carbon-nitride layer deposited on the titanium aluminum nitride layer; and a silicon carbon-nitride layer deposited on the titanium aluminum carbon-nitride layer.

5 Claims, 3 Drawing Sheets

COATING, ARTICLE COATED WITH COATING, AND METHOD FOR MANUFACTURING ARTICLE

CROSS-REFERENCE TO RELATED APPLICATIONS

The present application is related to co-pending U.S. patent application Ser. Nos. 13/008,987 and 13/008,991, entitled "COATING, ARTICLE COATED WITH COATING, AND METHOD FOR MANUFACTURING ARTICLE", by Zhang et al. These applications have the same assignee as the present application and has been concurrently filed herewith. The above-identified applications are incorporated herein by reference.

BACKGROUND

1. Technical Field

The exemplary disclosure generally relates to coatings, and particularly relates to articles coated with the coatings and method for manufacturing the articles.

2. Description of Related Art

Physical vapor deposition (PVD) has conventionally been used to form a coating on metal substrates of cutting tools or molds. Materials used for this coating are required to have excellent hardness and toughness. Presently, Titanium nitride (TiN) and Titanium-aluminum nitride (TiAlN) are mainly used as a material satisfying these requirements. However, these coating materials have a low hardness and a low temperature oxidation resistance.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary coating, article coated with the coating and method for manufacturing the article. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
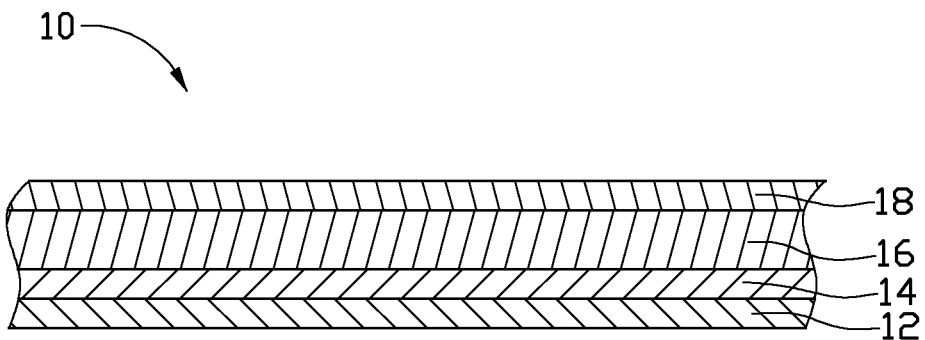
FIG. 1 is a cross-sectional view of an exemplary embodiment of coating.

Referring to FIG. 1, a coating 10 includes a titanium aluminum (TiAl) layer 12, a titanium aluminum nitride (TiAlN) layer 14 deposited on the TiAl layer 12, a titanium aluminum carbon-nitride (TiAlCN) layer 16 deposited on the TiAlN layer 14, and a silicon carbon-nitride (SiCN) layer 18 deposited on the TiAlCN layer 16. The TiAl layer 12, the TiAlN layer 14, the TiAlCN layer 16 and the SiCN layer 18 may be deposited by magnetron sputtering or cathodic arc deposition. The TiAl layer 12 has a thickness ranging from about 100 nanometers to about 300 nanometers. The TiAlN layer 14 has a thickness ranging from about 100 nanometers to about 300 nanometers. The TiAlCN layer 16 has a thickness ranging from about 0.6 micrometers to about 2.0 micrometers.

The atomic carbon content and the atomic nitrogen content in the TiAlCN layer 16 both gradually increase from near to the TiAlN layer 14 to away from the TiAlN layer 14. In other words, the atomic carbon content and the atomic nitrogen content in the TiAlCN layer 16 both gradually increase from the TiAlN layer 14 to the SiCN layer 18. The SiCN layer 18 has a thickness ranging from about 100 nanometers to about 400 nanometers. The coating 10 has a thickness ranging from about 0.7 micrometers to about 2.5 micrometers.

Figure 2:
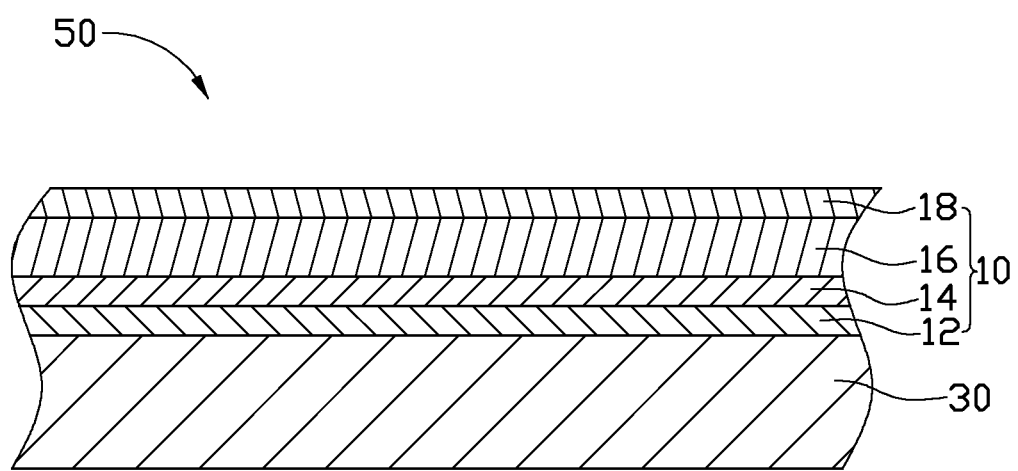
FIG. 2 is a cross-sectional view of an article coated with the coating in FIG. 1.

Referring to FIG. 2, an exemplary article 50 includes a substrate 30 and the coating 10 deposited on the substrate 30. The substrate 30 is made of a metal, such as high speed steel, hard alloy, or stainless steel. The article 50 may be cutting tools, molds, or housings of electronic devices.

Figure 3:
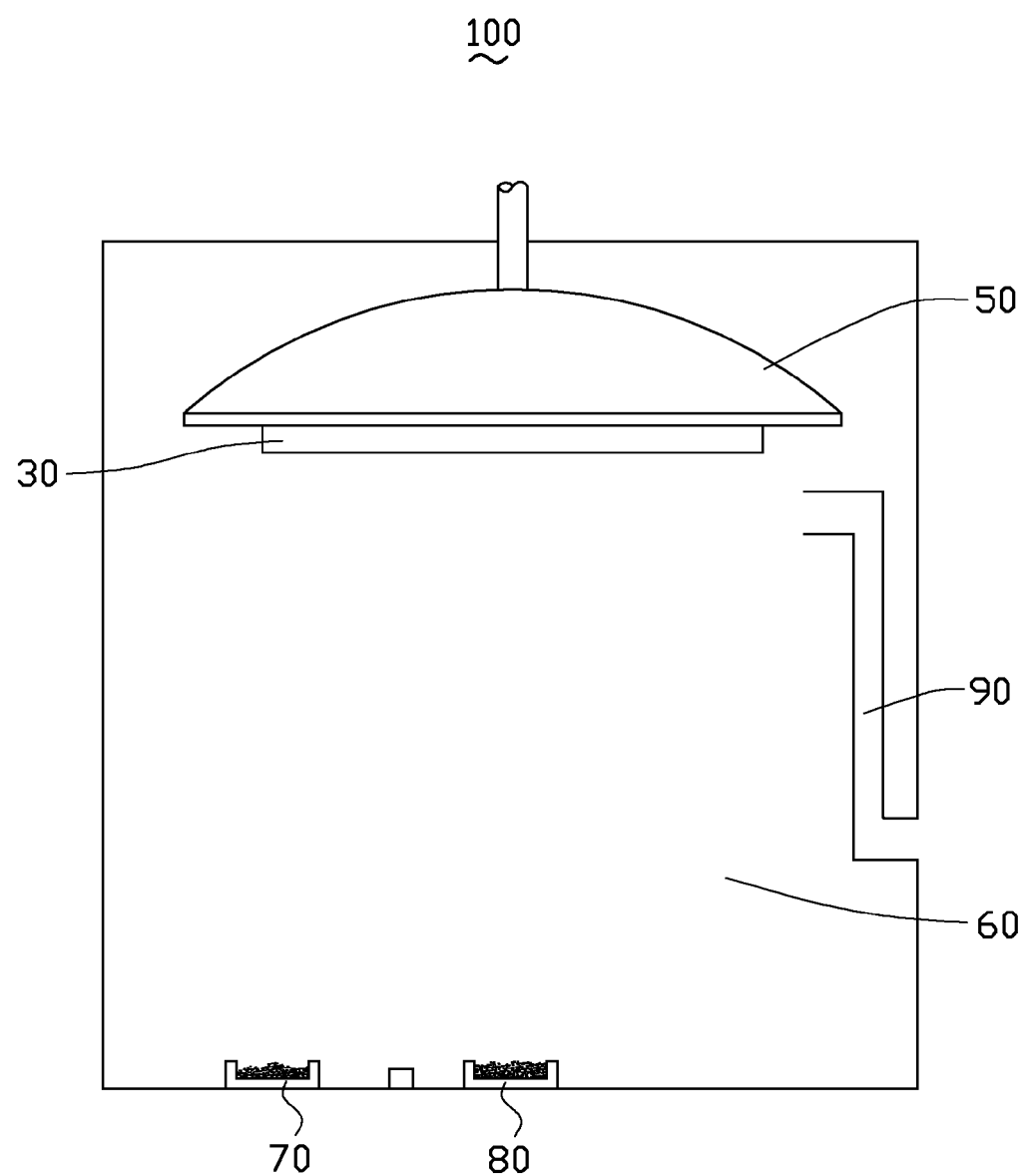
FIG. 3 is a schematic view of a magnetron sputtering coating machine for manufacturing the article in FIG. 2.

Referring to FIG. 3, a method for manufacturing the article 50 may include at least the steps of:

Providing a substrate 30, the substrate 30 may be made of high speed steel, hard alloy, or stainless steel.

Pretreating the substrate 30, by cleaning the substrate 30 using deionized water and alcohol successively. The substrate 30 is then washed with a solution (e.g., Alcohol or Acetone) in an ultrasonic cleaner, to remove impurities, such as grease, or dirt. The substrate 30 is dried. The substrate 30 is cleaned by argon plasma cleaning. The substrate 30 is retained on a rotating bracket 50 in a vacuum chamber 60 of a magnetron sputtering coating machine 100. The vacuum level of the vacuum chamber 60 is adjusted to about 8.0×10-3 Pa. Pure argon is fed into the vacuum chamber 60 at a flux of about 250 Standard Cubic Centimeters per Minute (sccm) to 500 sccm from a gas inlet 90. A bias voltage is applied to the substrate 30 in a range from −300 to −500 volts for about 10-15 minutes. Therefore, the substrate 30 is washed by argon plasma, to further remove the grease and dirt. Thus, the binding force between the substrate 30 and the coating 10 is enhanced.

A TiAl layer 12 is deposited on the substrate 30. The temperature in the vacuum chamber 60 is adjusted to 150~400° C. (Celsius degree); the argon is fed into the vacuum chamber 60 at a flux from about 100 sccm to 200 sccm from the gas inlet 90, preferably at about 150 sccm; a titanium aluminum alloy target 70 in the vacuum chamber 60 is evaporated at a power of from 2 kw to 10 kw; a bias voltage applied to the substrate 30 may be in a range from about −50 to about −200 volts and has a duty cycle of about 50%, for about 5 to about 10 min, to deposit the TiAl layer 12 on the substrate 30. The titanium aluminum alloy target contains atomic titanium in a range from about 50 to about 72 wt %.

A TiAlN layer 14 is deposited on the TiAl layer 12. The temperature in the vacuum chamber 60 is kept at about 150 to about 400° C.; argon is fed into the vacuum chamber 60 at a flux from about 100 sccm to about 200 sccm and nitrogen is fed into the vacuum chamber 60 at a flux from about 10 sccm to about 30 sccm from the gas inlet 90; the titanium aluminum alloy target 70 is evaporated at a power of from about 2 kw to about 10 kw; a bias voltage applied to the substrate 30 may be in a range from about −50 to about −200 volts and has a duty cycle of about 50%, for about 15 to about 20 min, to deposit the TiAlN layer 14 on the TiAl layer 12.

A TiAlCN layer 16 is deposited on the TiAlN layer 14. The temperature in the vacuum chamber 60 is kept at about 150 to about 400° C.; argon is fed into the vacuum chamber 60 at a flux from about 100 sccm to about 200 sccm, methane is fed into the vacuum chamber 60 at a flux from about 20 sccm to about 40 sccm and nitrogen is fed into the vacuum chamber 60 at a flux from about 20 sccm to about 40 sccm from the gas inlet 90; the titanium aluminum alloy target 70 is evaporated at a power of from about 2 kw to about 10 kw; a bias voltage applied to the substrate 30 may be in a range from about −50 to about −200 volts and has a duty cycle of about 50%, for about 40 to about 90 min, to deposit the TiAlCN layer 16 on the TiAlN layer 14. During depositing the TiAlCN layer 16 on the TiAlN layer 14, the flux of the nitrogen and the methane are both increased about 15 sccm to about 20 sccm every 10 minutes. Thus, the atomic carbon content and the atomic nitrogen content in the TiAlCN layer 16 both gradually increase from near to the TiAlN layer 14 to away from the TiAlN layer 14.

A SiCN layer 18 is deposited on the TiAlCN layer 16. The temperature in the vacuum chamber 60 is kept at about 150 to about 400° C.; argon is fed into the vacuum chamber 60 at a flux from about 100 sccm to about 150 sccm, methane is fed into the vacuum chamber 60 at a flux from about 10 sccm to about 50 sccm and nitrogen is fed into the vacuum chamber 60 at a flux from about 10 sccm to about 50 sccm from the gas inlet 90; a silicon target 80 in the vacuum chamber is evaporated at a power of from about 1 kw to about 3 kw; a bias voltage applied to the substrate 30 may be in a range from about −10 to about −70 volts and has a duty cycle of about 50%, for about 15 to about 30 min, to deposit the SiCN layer 18 on the TiAlCN layer 16.

During depositing the TiAlCN layer 16, atomic carbon can react with the atomic titanium, atomic aluminum and atomic nitrogen to form solid solution phrase and titanium-carbon phrase, which can improve the hardness of the TiAlCN layer 16. Additionally, the atomic carbon content in the TiAlCN layer 16 gradually increases from near to the TiAlN layer 14 to away from the TiAlN layer 14. Thus, the hardness of the TiAlCN layer 16 gradually increases from near to the TiAlN layer 14 to away from the TiAlN layer 14, i.e., the TiAlCN layer 16 can improve the hardness of the coating 10. Furthermore, the coefficient of thermal expansion of the TiAl layer 12 is close to the coefficient of thermal expansion of the substrate 30, so the stress generated between the TiAl layer 12 and the substrate 30 is small. Thus, the TiAl layer 12 can improve the binding force between the substrate 30 and the coating 10 so the coating 10 can be firmly deposited on the substrate 30. As mentioned above, the TiAlCN layer 16 can improve the hardness of the coating 10 and the TiAl layer 12 can improve the binding force between the substrate 30 and the coating 10, which can improve the abrasion resistance of the article 50.

When the coating 10 is located in high temperature and oxygen environment, the atomic silicon in the SiCN layer 18 can react with oxygen to form SiO2, which can prevent exterior oxygen from diffusing in the TiAlCN layer 16. Thus, the SiCN layer 18 causes the coating 10 to have high temperature oxidation resistance.

The hardness of the TiAlN layer 14 is between the hardness of the TiAlCN layer 16 and the hardness of the TiAl layer 12, so the TiAlN layer 14 can decrease the stress generated between the TiAlCN layer 16 and the TiAl layer 12.

The atomic carbon content and the atomic nitrogen content in the TiAlCN layer 16 both gradually increase from the TiAlN layer 14 to the SiCN layer 18. Therefore, the atomic carbon content and the atomic nitrogen content in the TiAlCN layer 16 near the TiAlN layer 14 are respectively lower than the atomic carbon content and the atomic nitrogen content in the TiAlCN layer 16 near the SiCN layer 18. The coefficient of thermal expansion of the TiAlCN layer 16 near the TiAlN layer 14 is close to the coefficient of thermal expansion of the TiAlN layer 14. The coefficient of thermal expansion of the TiAlCN layer 16 near the SiCN layer 18 is close to the coefficient of thermal expansion of the SiCN layer 18. Therefore, the binding force between the TiAlCN layer 16 and the TiAlN layer 14 and the binding force between the TiAlCN layer 16 and the SiCN layer 18 can be improved.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An article, comprising:
   a substrate; and
   a coating comprising:
   a titanium aluminum layer;
   a titanium aluminum nitride layer deposited on the titanium aluminum layer;
   a titanium aluminum carbon-nitride layer deposited on the titanium aluminum nitride layer; and
   a silicon carbon-nitride layer deposited on the titanium aluminum carbon-nitride layer.

2. The article as claimed in claim 1, wherein the atomic carbon content and the atomic nitrogen content in the titanium aluminum carbon-nitride layer both gradually increase from the titanium aluminum nitride layer to the silicon carbon-nitride layer.

3. The article as claimed in claim 2, wherein the titanium aluminum carbon-nitride layer has a thickness ranging from about 0.6 micrometers to about 2.0 micrometers.

4. The article as claimed in claim 3, wherein the titanium aluminum layer has a thickness ranging from about 100 nanometers to about 300 nanometers; the titanium aluminum nitride layer has a thickness ranging from about 100 nanometers to about 300 nanometers; the silicon carbon-nitride layer has a thickness ranging from about 100 nanometers to about 400 nanometers; the coating has a thickness ranging from about 0.7 micrometers to 2.5 micrometers.

5. The article as claimed in claim 1, wherein each of the titanium aluminum layer, the titanium aluminum nitride layer, and the titanium aluminum carbon-nitride layer is formed by magnetron sputtering, using a titanium aluminum alloy target containing atomic titanium in a range from about 50 to about 72 wt %.

\* \* \* \* \*